United States Patent
Chern et al.

(10) Patent No.: US 8,722,436 B2
(45) Date of Patent: May 13, 2014

(54) METHOD AND APPARATUS FOR ACCURATE DIE-TO-WAFER BONDING

(71) Applicant: TSMC Solid State Lighting Ltd., Hsinchu (TW)

(72) Inventors: Chyi Shyuan Chern, Taipei (TW); Hsin-Hsien Wu, Hsinchu (TW); Chih-Kuang Yu, Chiayi (TW); Hung-Yi Kuo, Taipei (TW)

(73) Assignee: TSMC Solid State Lighting Ltd., HsinChu (TW)

( * ) Notice: Subject to any disclaimer, the term of this patent is extended or adjusted under 35 U.S.C. 154(b) by 0 days.

(21) Appl. No.: 14/088,780

(22) Filed: Nov. 25, 2013

(65) Prior Publication Data

US 2014/0065741 A1    Mar. 6, 2014

Related U.S. Application Data

(62) Division of application No. 13/267,025, filed on Oct. 6, 2011, now Pat. No. 8,609,446.

(51) Int. Cl.
    *H01L 21/00*    (2006.01)

(52) U.S. Cl.
    USPC .................. 438/28; 438/110; 257/E21.51

(58) Field of Classification Search
    None
    See application file for complete search history.

(56) References Cited

U.S. PATENT DOCUMENTS

| | | | |
|---|---|---|---|
| 6,544,818 | B2 | 4/2003 | Yagi et al. |
| 7,915,722 | B2 | 3/2011 | Chou et al. |
| 8,183,761 | B2 | 5/2012 | Ogawa |
| 2007/0243667 | A1 | 10/2007 | Takano et al. |
| 2010/0304530 | A1 | 12/2010 | Yim et al. |

*Primary Examiner* — Cheung Lee
(74) *Attorney, Agent, or Firm* — Haynes and Boone, LLP (57) ABSTRACT

A method of light-emitting diode (LED) packaging includes coupling a number of LED dies to corresponding bonding pads on a sub-mount. A mold apparatus having concave recesses housing LED dies is placed over the sub-mount. The sub-mount, the LED dies, and the mold apparatus are heated in a thermal reflow process to bond the LED dies to the bonding pads. Each recess substantially restricts shifting of the LED die with respect to the bonding pad during the heating.

20 Claims, 9 Drawing Sheets

METHOD AND APPARATUS FOR ACCURATE DIE-TO-WAFER BONDING

PRIORITY DATA

This application is a divisional patent application of U.S. patent application Ser. No. 13/267,025, filed on Oct. 6, 2011, entitled "Method and Apparatus for Accurate Die-to-Wafer Bonding," the disclosure of which is hereby incorporated by reference in its entirety.

BACKGROUND

Light-emitting diode (LED) devices has experienced rapid growth in recent years. LED devices emit light when a voltage is applied. LED devices have increasingly gained popularity due to favorable characteristics such as small device size, long lifetime, efficient energy consumption, and good durability and reliability.

The fabrication of LED devices may involve a die-to-wafer bonding process, in which a plurality of LED dies are bonded to a plurality of bonding pads on a wafer. Conventional die-to-wafer bonding processes use auto die-bonding machines with a flux reflow oven or eutectic die-to-wafer bonders. During the bonding process, LED dies shift their lateral positions with respect to the bonding pads in any given direction. In some cases, the die-shift may exceed +/−38 microns. As the LED die size continues to decrease, the die-shift of conventional LED bonding processes is becoming a bigger issue because the reduction of reliability and performance for smaller LED devices is greater.

Therefore, although conventional LED die-to-wafer bonding processes have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

When turned on, light-emitting diode (LED) devices may emit radiation such as different colors of light in a visible spectrum, as well as radiation with ultraviolet or infrared wavelengths. Compared to traditional light sources (e.g., incandescent light bulbs), LED devices offer advantages such as smaller size, lower energy consumption, longer lifetime, variety of available colors, and greater durability and reliability. These advantages, as well as advancements in LED fabrication technologies that have made LED devices cheaper and more robust, have added to the growing popularity of LED devices in recent years.

Nevertheless, existing LED fabrication technologies may face certain shortcomings. One such shortcoming is die shifting in a bonding process. In more detail, as part of a die-to-wafer bonding process of LED devices, a plurality of LED dies may be bonded to a plurality of bonding pads located on a wafer. Existing LED fabrication technologies may utilize an auto die-bonding machine with flux reflow oven or eutectic die-to-wafer bonders to carry out the die-to-wafer bonding process. However, these approaches used by the existing LED fabrication technologies allow some die shifting during the bonding. That is, while the LED dies are being bonded to the bonding pads, an LED die may shift in a lateral direction with respect to the bonding pad below. In some cases, the amount of LED die shift may exceed +/−38 microns. As LED dies become smaller, such LED die shifting becomes increasingly undesirable, because it may lead to alignment challenges for later fabrication processes and may limit the applicability of advanced packaging processes.

According to various aspects of the present disclosure, described below is an LED fabrication process that substantially overcomes the LED die shifting issues present in existing LED fabrication processes. In more detail, FIGS. 1 to 8 are diagrammatic fragmentary cross-sectional side views and top views of a portion of a wafer at various fabrication stages. Note that FIGS. 1 to 8 have been simplified to focus on the inventive concepts of the present disclosure.

Figure 1:
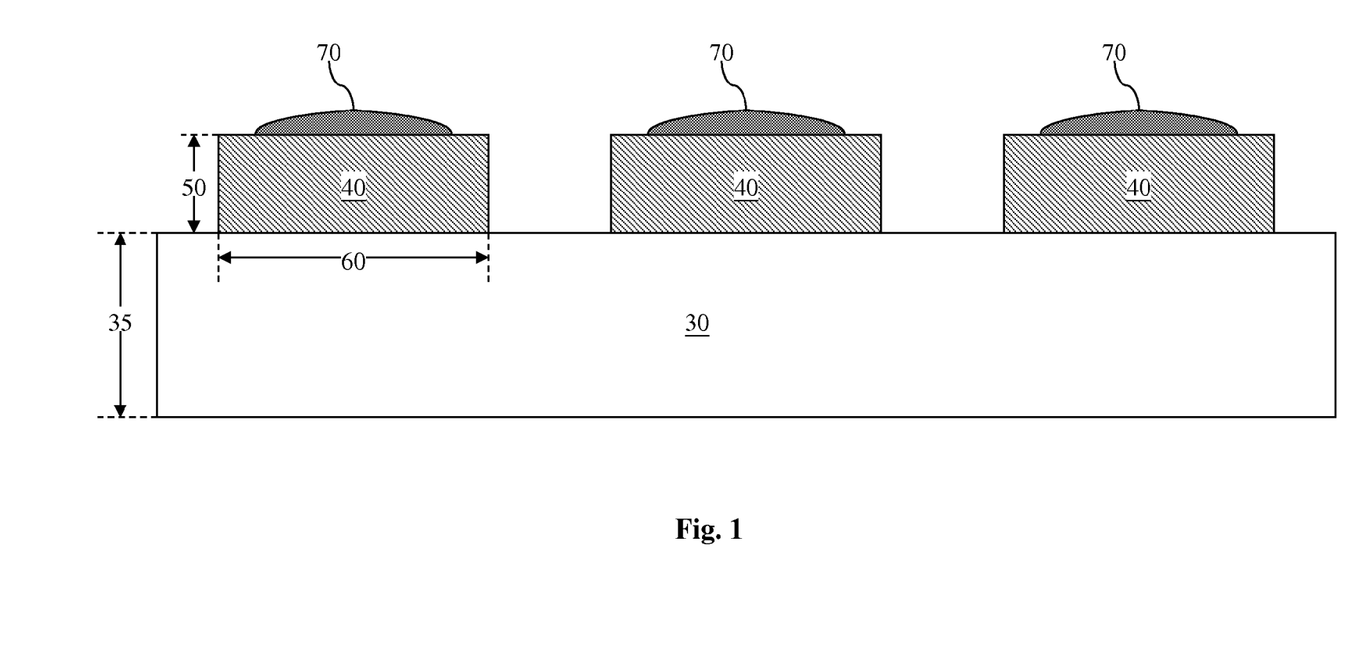
FIGS. 1-2 are diagrammatic fragmentary cross-sectional side views of a portion of a wafer having photonic devices disposed thereon at various stages of fabrication in accordance with various aspects of the present disclosure.

Referring to FIG. 1, a sub-mount 30 is provided. The sub-mount 30 may also be referred to as a substrate or as a wafer. In one embodiment, the sub-mount 30 includes a semiconductor material, such as silicon (Si). In other embodiments, the sub-mount 30 may include an aluminum nitride (AlN) material, an aluminum oxide ($Al_2O_3$) material, or a ceramic material. Among other things, the sub-mount 30 may be used to provide electrostatic discharge protection, efficient thermal dissipation (of the LED dies), and/or stress reduction. The sub-mount 30 is sufficiently thick, partly in order to ensure that the sub-mount 30 can perform these functions adequately. In an embodiment, the sub-mount 30 has a thickness 35 that is in a range from about 100 microns to about 400 microns. In alternative embodiments, the thickness 35 may be thicker than 400 microns.

A plurality of bonding pads are formed on the sub-mount 30. For the sake of simplicity, only three of such bonding pads 40 are illustrated herein, but many more bonding pads are usually formed on the sub-mount 30. The bonding pads 40 may also be referred to as a die-bonding pad layer. These bonding pads 40 are used for the bonding of photonic devices such as LED dies in a bonding process. The bonding pads 40 include a conductive material such as metal, which is both electrically conductive and thermally conductive. In an embodiment, the bonding pads 40 include gold (Au) and nickel (Ni). For example, the bonding pads 40 may each include gold-plated nickel.

The bonding pads 40 each have a thickness 50. In an embodiment, the thickness 50 is in a range from about 1.5 microns to about 50 microns, for example, about 5 microns. The bonding pads 40 also each have a lateral dimension 60. The lateral dimension 60 is measured horizontally (i.e., parallel to the surface of the sub-mount 30) in the figures shown herein. In an embodiment, the lateral dimension 60 is in a range from about 0.6 millimeters to about 6 millimeters, for example, about 1 millimeter.

Next, a flux material 70 is provided on the bonding pads 40. The flux material 70 helps facilitate soldering by preventing oxidation and providing chemical cleaning to the exposed surfaces of the bonding pads 40. The flux material 70 may include water-soluble fluxes, no-clean fluxes, or rosin fluxes. The flux material 70 on the bonding pads 40 is optional and may be omitted in alternative embodiments.

Figure 2:
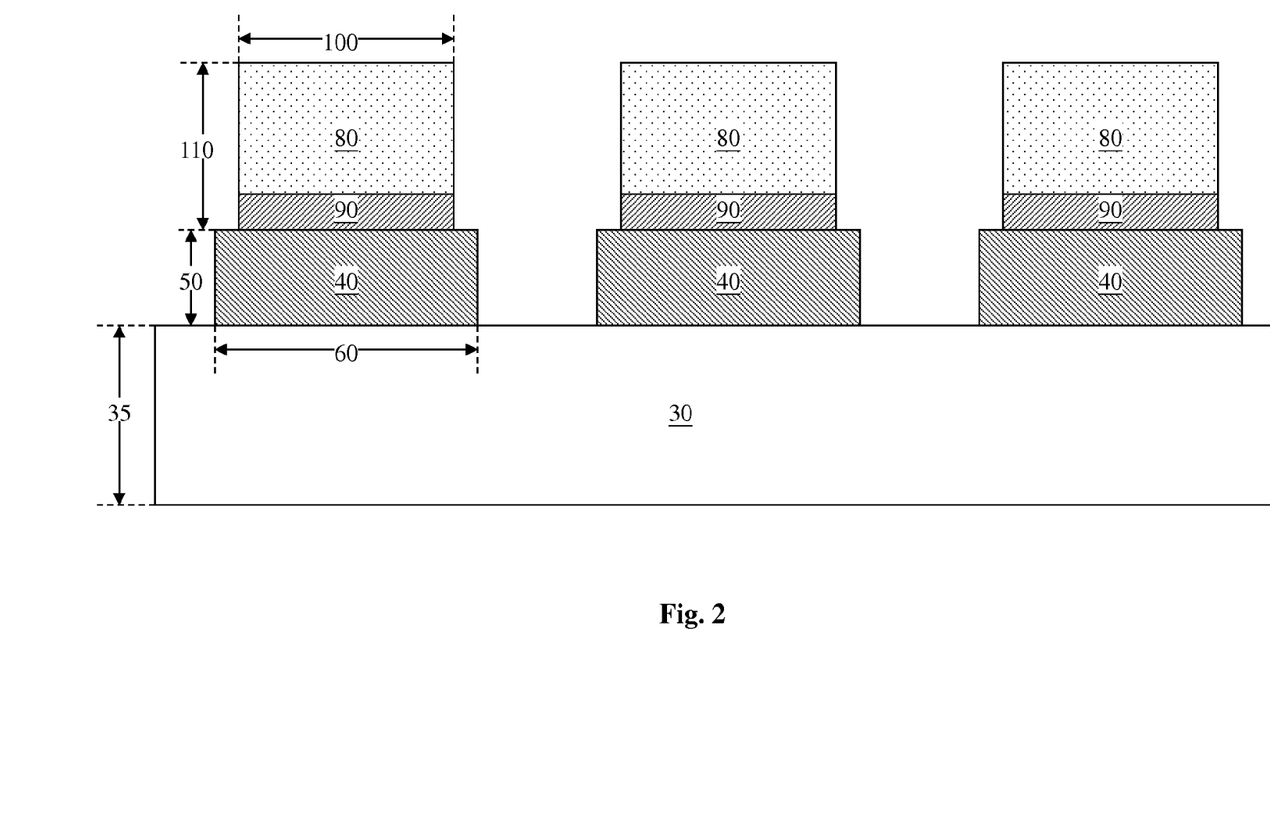

Referring now to FIG. 2, a plurality of photonic devices are placed on the bonding pads. For the sake of providing an example, three of such photonic devices 80 are shown in FIG. 2, though many more photonic devices similar to the photonic devices 80 may be placed on the bonding pads. Each of the photonic devices 80 is placed on a respective one of the bonding pads 40.

In an embodiment, the photonic devices 80 include LED dies or LED chips and may therefore be referred to as LED dies or LED devices 80 thereafter. The LED devices 80 each include two oppositely doped semiconductor layers. In one embodiment, the oppositely doped semiconductor layers each contain a "III-V" family (or group) compound. In more detail, a III-V family compound contains an element from a "III" family of the periodic table, and another element from a "V" family of the periodic table. For example, the III family elements may include Boron, Aluminum, Gallium, Indium, and Titanium, and the V family elements may include Nitrogen, Phosphorous, Arsenic, Antimony, and Bismuth. In the present embodiment, the oppositely doped semiconductor layers include a p-doped gallium nitride (GaN) material and an n-doped gallium nitride material, respectively. The p-type dopant may include Magnesium (Mg), and the n-type dopant may include Carbon (C) or Silicon (Si).

According to various embodiments, the LED devices 80 also each include a multiple-quantum well (MQW) layer that is disposed in between the oppositely doped layers. The MQW layer includes alternating (or periodic) sub-layers of active material, such as gallium nitride and indium gallium nitride (InGaN). For example, the MQW layer may include a number of gallium nitride sub-layers and a number of indium gallium nitride sub-layers, wherein the gallium nitride sub-layers and the indium gallium nitride sub-layers are formed in an alternating or periodic manner. In one embodiment, the MQW layer includes ten sub-layers of gallium nitride and ten sub-layers of indium gallium nitride, where an indium gallium nitride sub-layer is formed on a gallium nitride sub-layer, and another gallium nitride sub-layer is formed on the indium gallium nitride sub-layer, and so on and so forth. Each of the sub-layers within the MQW layer is oppositely doped from its adjacent sub-layer. That is, the various sub-layers within the MQW layer are doped in an alternating p-n fashion. The light emission efficiency depends on the number of layers of alternating layers and thicknesses.

The doped layers and the MQW layer may all be formed by an epitaxial growth process known in the art. After the completion of the epitaxial growth process, an LED is created by the disposition of the MQW layer between the doped layers. When an electrical voltage (or electrical charge) is applied to the doped layers of the LED devices 80, the MQW layer emits radiation such as light. The color of the light emitted by the MQW layer corresponds to the wavelength of the radiation. The radiation may be visible, such as blue light, or invisible, such as ultraviolet (UV) light. The wavelength of the light (and hence the color of the light) may be tuned by varying the composition and structure of the materials that make up the MQW layer.

The LED devices 80 are coupled to die-bonding components 90. The die-bonding components 90 include a conductive material such as metal. In an embodiment, the die-bonding components 90 include gold and nickel layers. In other embodiments, the die-bonding components 90 may include lead-free solder such as a suitable alloy of tin (Sn), copper (Cu), and silver (Ag).

As FIG. 2 illustrates, the LED devices 80 have a lateral dimension 100 that is no greater than the lateral dimension 60 of the bonding pads 40. In an embodiment, the lateral dimension 100 is in a range from about 300 microns to about 5000 microns. The LED devices 80 and the die-bonding components 90 collectively have a thickness 110. In an embodiment, the thickness 110 is in a range from about 110 microns to about 400 microns.

The LED devices 80 are placed on the bonding pads through the die-bonding components 90. For example, an auto die-to-wafer pick-and-place machine may be used to accurately place the LED devices 80 (and the die-bonding components attached thereto) on the bonding pads 40. The flux material (shown as element 70 in FIG. 1) couples together the bonding pads 40 and the die-bonding pads 90, respectively. However, the strength of coupling based on the stickiness of the flux material is not very strong. Consequently, the LED devices 80 may experience lateral displacement or shift with respect to the bonding pads 40. When such lateral displacement occurs in a later bonding process (for example a bonding process that takes place in a reflow oven), the position-shifted LED devices 80 is permanently bonded to the bonding pads 40 with the shift in place. This phenomenon is referred to as die-shift. For existing LED processes, such die-shift may exceed over 30 microns. The severity of die-shift under existing LED fabrication methodologies may handicap the applicability of advanced LED packaging/die processes. In other words, advanced LED packaging/die processes have very low tolerances for die-shift, which is less than some of the existing LED processes.

Figure 3:
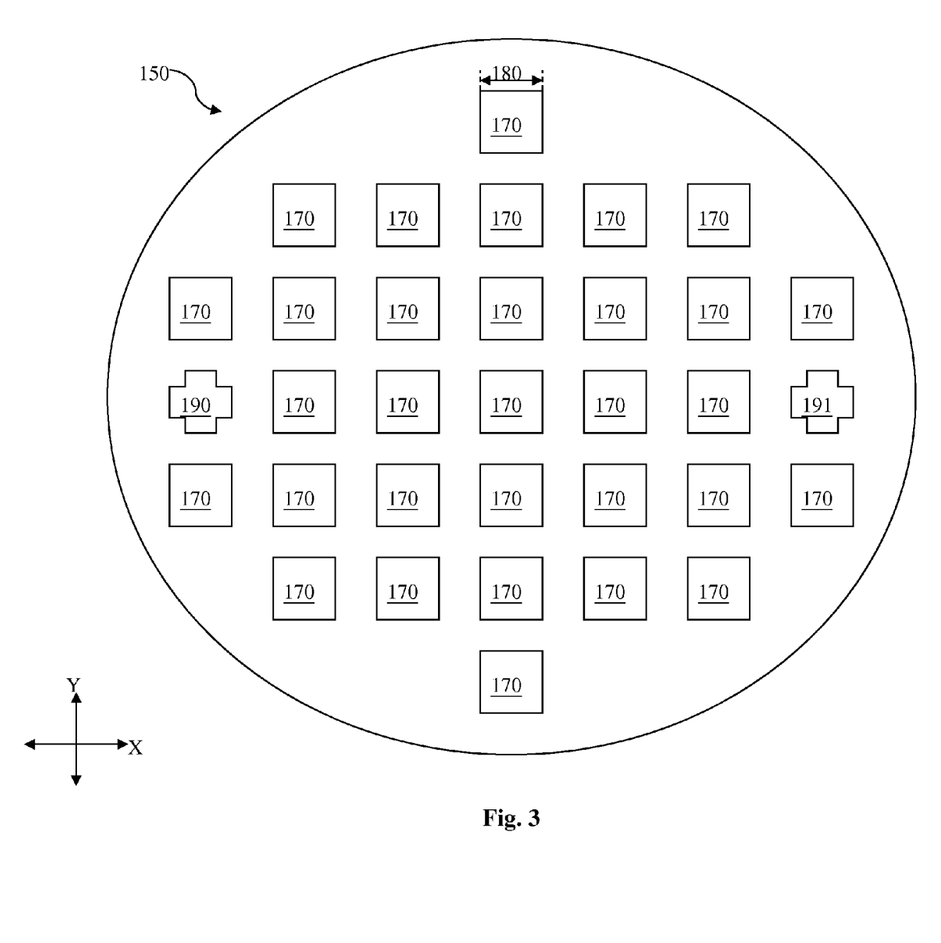
FIG. 3 is a diagrammatic top view of a mold fixture.

According to various aspects of the present disclosure, a mold fixture is used to substantially alleviate the die-shift issue discussed above. Referring to FIG. 3, a simplified top view of an embodiment of a mold fixture 150 is illustrated. The mold fixture 150 may be made of a metal, a quartz material, a sapphire material, or a ceramic material. The mold fixture 150 has a plurality of concave openings or recesses 170. In an embodiment, the number of recesses 170 corresponds to the number of LED devices placed on the sub-mount 30. The recesses 170 each have a lateral dimension 180, which may be measured in an X-direction or in a Y-direction. The lateral dimension 180 of the recesses 170 is just a little greater than the lateral dimension 100 of the LED devices 80 (shown in FIG. 2). In an embodiment, the lateral dimension 180 is in a range from about 0.38 millimeters to about 5.1 millimeters.

The recesses 170 are to be used to cover the LED devices (e.g., LED devices 80) placed on the sub-mount 30. The recesses 170 are designed to house the LED devices therein during the reflow process or eutectic metal bonding process and to have lateral dimensions small enough so as to restrict lateral displacement of the LED devices. In this manner, the die-shifting issue discussed above will be substantially alleviated. This aspect of operation is discussed in more detail below.

The mold fixture 150 may also include one or more alignment marks 190 and 191. In the illustrated embodiment, the alignment marks 190 and 191 are located on opposite sides of the mold fixture 150, but it is understood that the alignment marks may be located in different areas of the mold fixture 150 in alternative embodiments. The alignment marks 190 and 191 help align the mold fixture accurately with the sub-mount, so that each recess 170 is aligned with a respective one of the LED devices.

Figure 4:
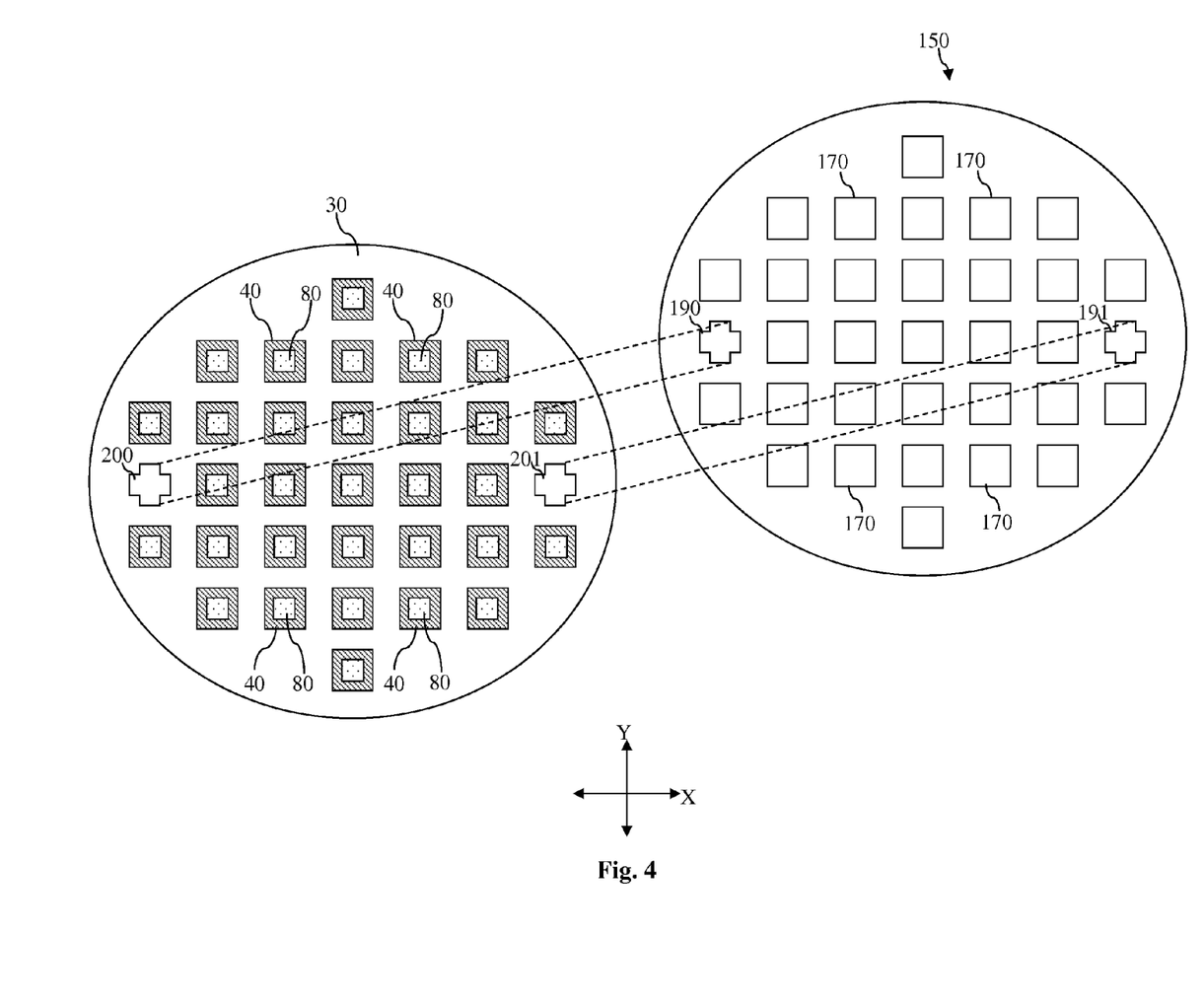
FIG. 4 is a diagrammatic top view of a mold fixture and a wafer having photonic devices disposed thereon.

FIG. 4 illustrates a simplified top view of a sub-mount 30 having a plurality of bonding pads 40 and a plurality of LED devices 80 that are placed on the bonding pads 40, as well as a simplified top view of the mold fixture 150. The sub-mount 30 also includes alignment marks 200 and 201. In the illustrated embodiment, the alignment marks 200-201 are disposed on opposite sides of the sub-mount 30.

The mold fixture 150 is positioned in a manner so that the alignment marks 190-191 are respectively aligned with the alignment marks 200-201 of the sub-mount 30. Although the sub-mount 30 and the mold fixture 150 are shown separately, it is understood that FIG. 4 is intended to portray a state of superposition between the sub-mount 30 and the fixture 150. That is, when the alignment marks 190-191 are respectively aligned with the alignment marks 200-201 of the sub-mount 30, the mold fixture 150 may be substantially disposed over and aligned with the sub-mount 30. In particular, the mold fixture 150 is designed and manufactured with high precision instruments such that the dimensions and locations of the recesses 170 and alignment marks 190 and 191 are finely tuned and controlled. Here, once alignment is achieved between the sub-mount 30 (below) and the mold fixture 150 (above), each of the recesses 170 is substantially aligned with a respective one of the LED devices 80 below. In some embodiments, an optical (e.g., laser) positioning system may also be employed to enhance the alignment accuracy. In other embodiments, the alignment marks are physical. For example, the alignment mark 190 may be a shape that fits in a slot. Although the drawings show a cross shape, the alignment marks 190/191 and 200/201 may be any other appropriate shape.

Figure 5:
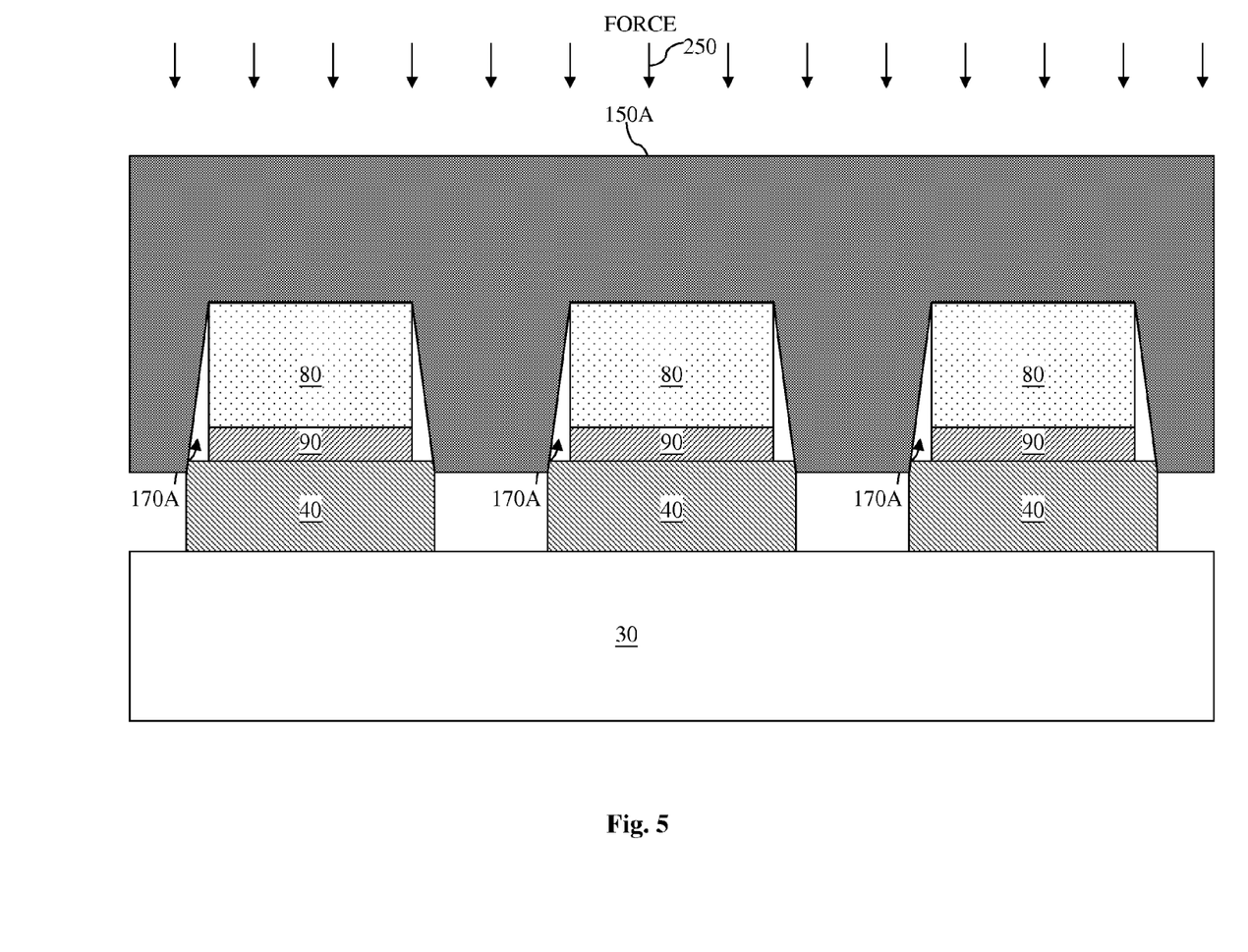
FIGS. 5-7 are diagrammatic fragmentary cross-sectional side views of different embodiments of a mold fixture being placed on a sub-mount having photonic devices disposed thereon.

Once alignment is achieved between the sub-mount 30 and the mold fixture 150, the mold fixture 150 is placed on the sub-mount 30, with each recess 170 covering a respective one of the LED devices 80 therebelow. This is illustrated in FIG. 5, which shows a simplified fragmentary cross-sectional view of the sub-mount 30 and an embodiment of the mold fixture 150A after the mold fixture 150A is placed on top of the sub-mount 30. The LED devices 80 are covered by recesses 170A. In the embodiment illustrated herein, the recesses 170A have approximately trapezoidal shapes with sloped or tapered sidewalls (i.e., the recesses are wider toward the surface of the mold fixture). The sloped sidewalls of the recesses 170A make it easier for the LED devices 80 to be "inserted" into the recesses as the mold fixture 150A is being placed on the sub-mount 30. It is understood, however, that the recesses 170A may have other suitable shapes in alternative embodiments, some of which will be shown in the following figures and discussed in more detail below.

The LED devices 80 are in effect "pinned" by the recesses 170A, such that the lateral movement of the LED devices 80 is limited or restricted. In other words, it is difficult for the LED devices 80 to move in any lateral direction because the sidewalls of the recesses would block or prevent such movement. In this manner, the LED devices 80 can be held in place during later fabrication stages, such as during a thermal reflow process. Consequently, the undesirable die-shift issues discussed above can be substantially alleviated. In an embodiment, the amount of die-shift in any lateral direction is less than about 10 microns, for example within about 5 microns.

Though not specifically shown for the sake of simplicity, it is understood that the mold fixture 150A can be secured with respect to the sub-mount 30. For example, a screw, a chuck, a stand, or another suitable mechanism may be used to attach the mold fixture 150A to the sub-mount 30. The securing mechanism allows the mold fixture 150A to remain stationary relative to the sub-mount 30 (and thus to the bonding pads 40) even as other forces may be applied to the mold fixture 150A, forces that would have otherwise shifted the mold fixture 150A. Such shift of the mold fixture 150A with respect to the sub-mount 30 would have been undesirable, since it would have led to the shifting of the LED devices 80 as well. Therefore, the mold fixture 150A is implemented to be securely attached to the sub-mount 30 so that substantially little or no shifting between the mold fixture 150A and the sub-mount can occur.

In the illustrated embodiment, the upper surface of the LED devices 80 comes into physical contact with the LED devices 80. As such, a force 250 can be applied to the LED devices 80 through the mold fixture 150A. For example, the force 250 may be the weight of the mold fixture 150A in an embodiment. The weight of the mold fixture 150A can be adjusted by changing the size (e.g., the thickness of the mold fixture 150A), material composition, and/or shape of the mold fixture 150A during the design and fabrication of the mold fixture 150A. Thus, a desired amount of force 250 can be obtained by adjusting the weight of the mold fixture 150A. In other embodiments, the force 250 may be applied externally. For example, a weight may be placed on the upper surface of the mold fixture 150A, or a machine may push down on the upper surface of the mold fixture 150A, where the machine can deliver an adjustable amount of force. In any case, it can be seen that the force 250 is tunable or adjustable. The force 250 is at least partially delivered to the LED devices 80, which is beneficial because the application of the force 250 may aid the bonding between the LED devices 80 and the bonding pads 40 in a bonding process.

Figure 6:
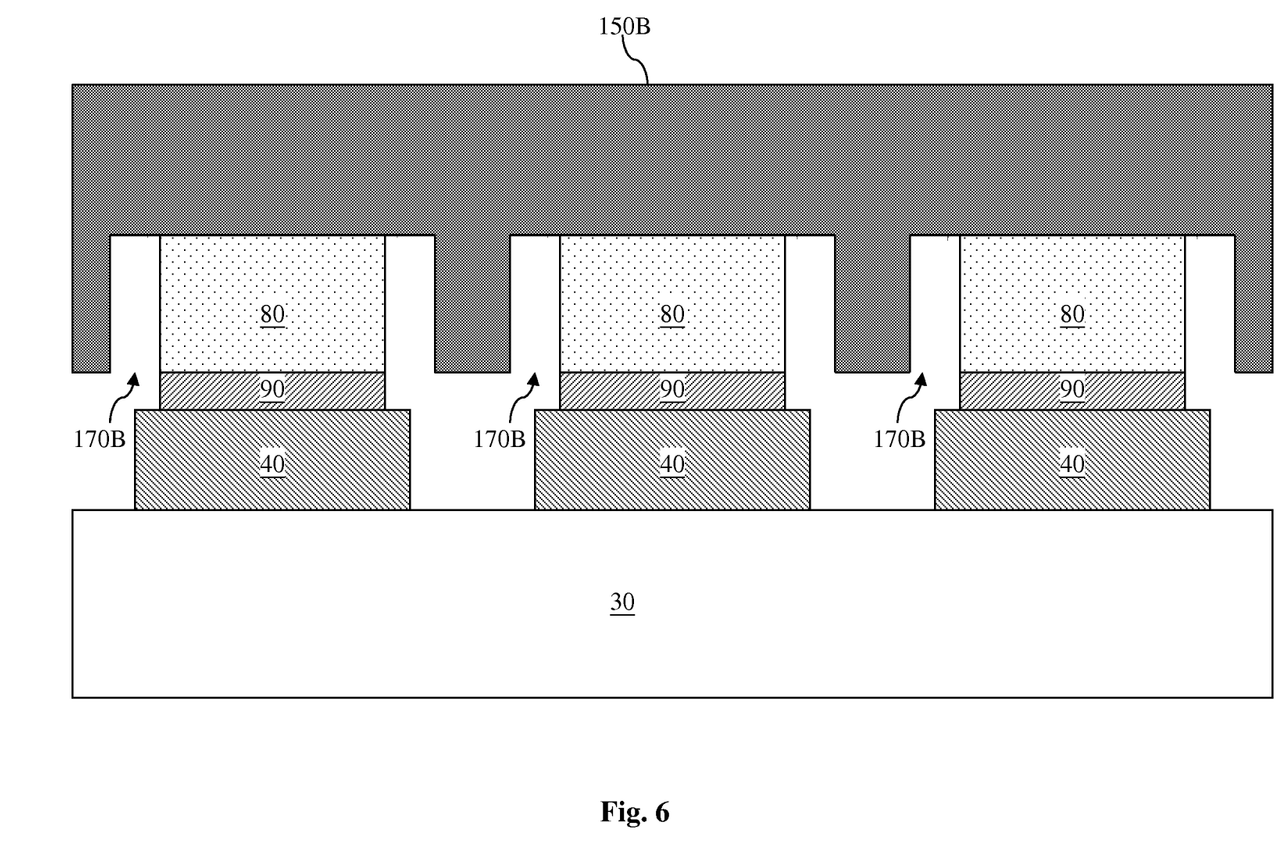

FIG. 6 illustrates a simplified fragmentary cross-sectional view of another embodiment of a mold fixture 150B after it is placed on the sub-mount 30. For the sake of consistency and clarity, similar components in FIGS. 5 and 6 are labeled the same. Compared to the mold fixture 150A shown in FIG. 5, the recesses 170B of the mold fixture 150B have different depths and lateral dimensions. For example, the recesses 170B of the mold fixture 150B may be shallower but wider than those of the mold fixture 150A, as is illustrated in FIG. 6. Alternatively, the recesses 170B of the mold fixture 150B may be deeper and/or narrower than those of the mold fixture 150A, depending on the fabrication needs and requirements. The sizes and shapes of the recesses 170B may be adjusted to account for the degree of alignment and/or restriction on die-shift. In addition, the recesses 170B may have substantially straight (vertical) profiles rather than tapered profiles in some embodiments. It is understood that similar to the mold fixture 150A, the mold fixture 150B may also be secured to the sub-mount 30, and a force may also be applied through the mold fixture 150B to facilitate the bonding between the LED devices 80 and the bonding pads 40.

Figure 7:
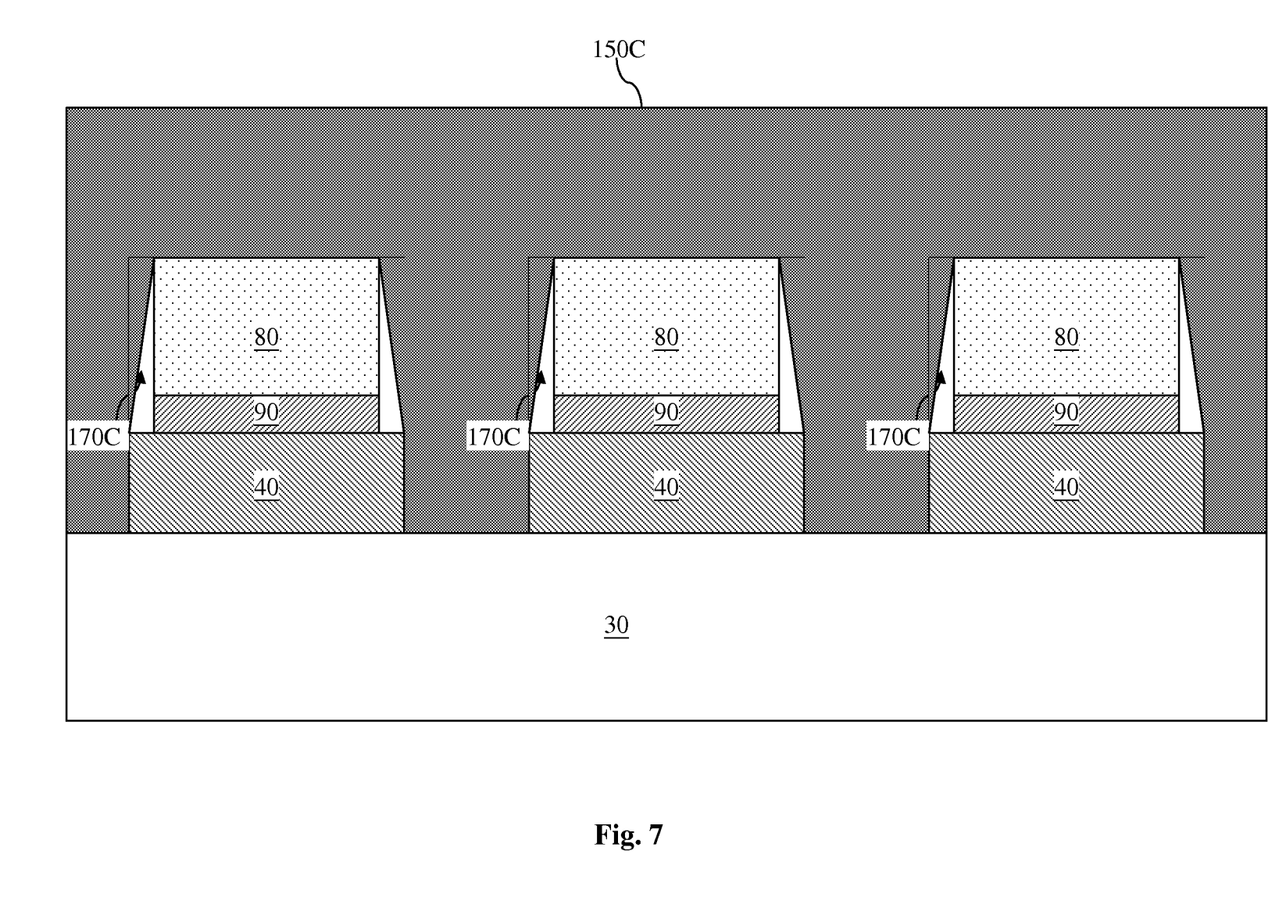

FIG. 7 illustrates a simplified fragmentary cross-sectional view of yet another embodiment of a mold fixture 150C after it is placed on the sub-mount 30. For the sake of consistency and clarity, similar components in FIGS. 5-7 are labeled the same. The recesses 170C of the mold fixture 150C may have tapered profiles in some embodiments or substantially straight profiles in other embodiments. The recesses 170C of the mold fixture 150C may also completely cover the bonding pads 40. Stated differently, the bottom surface of the mold fixture 150C may come into physical contact with the upper surface of the sub-mount 30. It is also understood that similar to the mold fixture 150A, the mold fixture 150C may be secured to the sub-mount 30, and a force may also be applied through the mold fixture 150C to facilitate the bonding between the LED devices 80 and the bonding pads 40.

Additional configurations of the mold fixture 150 are not discussed herein for the sake of simplicity, but is understood that the sizes and shapes of the recesses 170 may be adjusted to account for different considerations such as alignment and restriction on the amount of die-shift.

Figure 8:
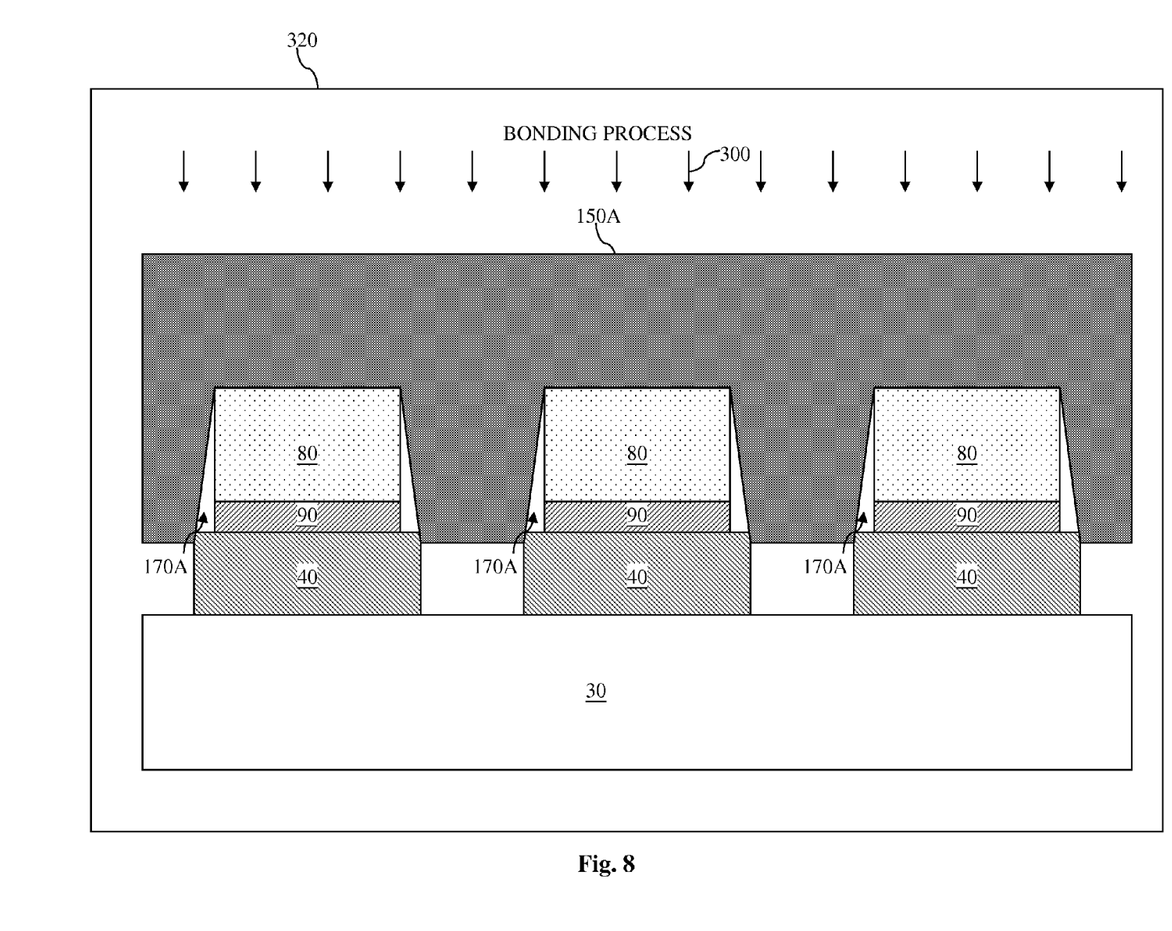
FIG. 8 is a diagrammatic fragmentary cross-sectional side view of a mold fixture and a sub-mount having LED devices undergoing a bonding process in an oven.

Referring to FIG. 8, a bonding process 300 is performed to bond the LED devices 8-to the bonding pads 40. The mold fixture 150 remains placed on the sub-mount 30 while the bonding process 300 is being performed. As such, the amount of die-shift during the bonding process 300 is substantially reduced. Note that the edge of the mold fixture 150 may extend past the top of the bond pads 40. In an embodiment, the bonding process 300 includes a thermal process that is performed at a reflow oven 320. The thermal process may be performed at temperatures greater than about 210 degrees Celsius. The material composition of the mold fixture 150 is selected such that it can withstand the high temperatures of the thermal process. After the bonding process is finished, the mold fixture 150 can be removed. It is also understood that other methods of bonding may be used in alternative embodiments, such as eutectic bonding. Furthermore, additional processes may be performed to finish the packaging of the LED devices, but they are not discussed herein for the sake of simplicity.

Figure 9:
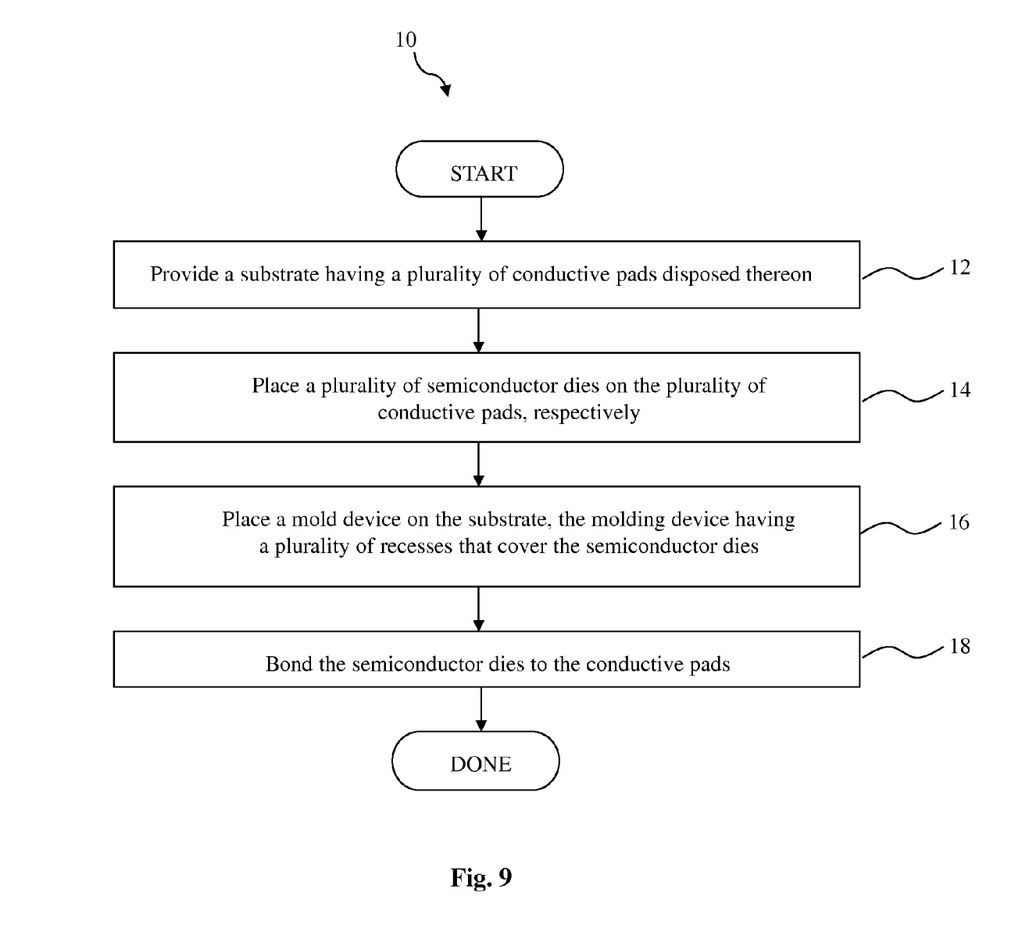
FIG. 9 is a flowchart illustrating a method for fabricating a photonic device according to various aspects of the present disclosure.

FIG. 9 is a flowchart of a method 10 for fabricating a photonic device according to various aspects of the present disclosure. Referring to FIG. 9, the method 10 includes block 12, in which a substrate is provided. The substrate has a plurality of conductive pads disposed thereon. The conductive pads may be bonding pads and may include a metal material. The method 10 includes block 14, in which a plurality of semiconductor dies is placed on the plurality of conductive pads, respectively. The semiconductor dies may include photonic devices such as LED devices. The method 10 includes block 16, in which a mold device on the substrate. The mold device has a plurality of recesses that cover the semiconductor dies. The recesses each cover a respective one of the semiconductor dies in a manner such that the recesses restrict the lateral movement of the semiconductor dies. The method 10 includes block 18, in which the semiconductor dies are bonded to the conductive pads. The bonding process may include a thermal reflow process performed in a reflow oven. It is understood that additional processes may be performed before, during, or after the blocks 12-18 discussed herein to complete the fabrication of the photonic devices.

The embodiments of the present disclosure discussed above offer advantages over existing methods. However, that other embodiments may offer different advantages, and that no particular advantage is required for any embodiment. One of the advantages is that the LED die-shift is substantially reduced. Through the use of the mold fixture, the LED devices can be held in place when they are bonded to the bonding pads. As a result, the die-shift may be controlled to be within about 5 microns, which allows advanced packaging processes to be applied later.

An additional advantage is that the application of the mold fixture does not involve extra fabrication stages or additional processing time. The mold fixture is fabricated in a manner to withstand high temperatures, and thus it requires no modifications to the bonding processes either. Therefore, LED production throughput is not reduced.

Yet a further advantage is that the mold fixture can be used to apply pressure to the LED devices to facilitate the bonding process. The pressure is tunable through adjusting the weight of the mold fixture or a force applied to the mold fixture by another machine. Other advantages may exist, but they are not discussed herein for the sake of simplicity.

One of the broader forms of the present disclosure involves a method. The method includes: providing a substrate having a plurality of conductive pads; placing a plurality of semiconductor dies on the plurality of conductive pads; placing a mold device on the substrate, the mold device having a plurality of recesses, wherein the placing the mold device is carried out in a manner such that each of the semiconductor dies is covered by a respective one of the recesses; and thereafter bonding the semiconductor dies to the conductive pads.

In various embodiments, the placing the mold device is carried out in a manner such that each recess substantially restricts movement of the semiconductor die that is covered by the recess.

In some embodiments, the placing the mold device is carried out in a manner such that each semiconductor die covered by the recess has a movement range that is less than about 5 microns in any lateral direction.

In certain embodiments, the placing the mold device is carried out in a manner such that the mold device is secured with respect to the substrate, so that the mold device is substantially free of lateral movement with respect to the substrate.

In some embodiments, the placing the mold device is carried out in a manner such that the mold device applies pressure to the semiconductor dies.

In some embodiments, the recesses each have a sloped profile. In other embodiments, the recesses have different profiles based on its position relative to a center of the sub-mount. In still other embodiments, the recesses each have vertical sidewalls.

In some embodiments, the bonding includes heating the substrate, the semiconductor dies, and the mold device in a reflow oven.

In some embodiments, the method further includes: applying a flux material on each of the conductive pads before the semiconductor dies are placed on the conductive pads; and aligning each of the recesses of the mold device with a respective one of the semiconductor dies before the mold device is placed on the substrate.

In various embodiments, the semiconductor dies include light-emitting diode (LED) devices.

Another of the broader forms of the present disclosure involves a method of fabricating a photonic device. The method includes: providing a wafer having a plurality of bonding pads disposed thereon; positioning a plurality of photonic devices on the plurality of bonding pads, respectively; covering the photonic devices with a mold fixture having a plurality of concave openings, wherein each photonic device is secured by a respective one of the concave openings in a manner such that a lateral shift between each photonic device and the respective bonding pad therebelow is less than a predefined value; and bonding the photonic devices to the bonding pads while the photonic devices are covered by the mold fixture, wherein the bonding is carried out at least in part through a thermal process.

In some embodiments, the covering is carried out in a manner such that the predefined value is about 10 microns.

In some embodiments, the covering includes securing the mold fixture such that the mold fixture is substantially free of lateral shift with respect to the wafer.

In some embodiments, the method further includes: applying a tunable amount of pressure through the mold fixture to each of the photonic devices.

In some embodiments, the concave openings each have a tapered cross-sectional profile.

In some embodiments, the method further includes: before the positioning, applying a flux material on each of the bonding pads in a manner so that the photonic devices are coupled to the bonding pads through the flux material; and before the covering, aligning the mold fixture with the wafer in a manner such that each concave opening is substantially aligned with a respective one of the photonic devices.

Still another of the broader forms of the present disclosure involves a method of light-emitting diode (LED) packaging. The method includes: providing a sub-mount having a plurality of bonding pads disposed thereon; coupling a plurality of LED dies to the plurality of bonding pads, wherein each LED die is coupled to a respective one of the bonding pads; providing a mold apparatus, the mold apparatus including a plurality of concave recesses; placing the mold apparatus over the sub-mount, wherein each LED die is housed in a respective one of the recesses; and thereafter heating the sub-mount, the LED dies, and the mold apparatus in a thermal reflow process, thereby causing the LED dies to be bonded to the bonding pads, respectively; wherein each recess substantially restricts a positional shift of the LED die below with respect to the bonding pad coupled thereto during the heating.

In some embodiments, the placing the mold apparatus is carried out in a manner such that the mold apparatus is position-secured relative to the sub-mount.

In some embodiments, the placing the mold apparatus includes applying a predetermined amount of pressure to the LED dies through the mold apparatus.

In some embodiments, the placing the mold apparatus includes aligning the recesses with the LED dies through an optical positioning process.

In some embodiments, the recesses of the mold apparatus each have a non-uniform cross-sectional profile.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
   placing a plurality of dies on a substrate;
   aligning a mold fixture with the substrate, the mold fixture having a plurality of openings for accommodating the plurality of dies, respectively, wherein the aligning is performed such that each opening is aligned with a respective one of the dies therebelow;
   setting the mold fixture on the substrate in a manner such that each of the openings is in direct contact with, and positionally pins, the respective die disposed therein; and
   thereafter applying a thermal process to the substrate while the mold fixture is set on the substrate.

2. The method of claim 1, wherein:
   the substrate includes a first alignment mark;
   the mold fixture includes a second alignment mark; and
   the aligning comprises aligning the first alignment mark with the second alignment mark.

3. The method of claim 1, wherein the setting comprises securing the mold fixture to the substrate such that the mold fixture remains stationary with respect to the substrate when the thermal process is applied.

4. The method of claim 3, wherein the securing comprises attaching the mold fixture to the substrate via one of: a screw, a chuck, or a stand.

5. The method of claim 1, wherein:
   the substrate includes a plurality of bonding pads each having flux disposed thereon;
   the placing comprises placing each of the dies on a respective one of the bonding pads; and
   the thermal process is performed such that the flux is melted so as to facilitate a bonding of the plurality of the dies to their respective bonding pads.

6. The method of claim 1, further comprising: delivering an external downward pressure to the mold fixture.

7. The method of claim 1, wherein the dies each include a light-emitting diode (LED).

8. The method of claim 1, wherein the openings of the mold fixture have tapered side view profiles.

9. The method of claim 1, wherein the setting is performed such that a bottom surface of each opening is in direct contact with the respective die disposed therein.

10. A method of fabricating a photonic device, comprising:
    providing a wafer having a plurality of bonding pads disposed thereon;
    positioning a plurality of photonic devices on the plurality of bonding pads, respectively;
    covering the photonic devices with a mold fixture having a plurality of concave openings, wherein each photonic device is secured by a respective one of the concave openings, and wherein a lateral shift between each photonic device and the respective bonding pad therebelow is less than a predefined value; and
    bonding the photonic devices to the bonding pads while the photonic devices are covered by the mold fixture, wherein the bonding is carried out at least in part through a thermal process.

11. The method of claim 10, wherein the predefined value is about 10 microns.

12. The method of claim 10, wherein the covering includes securing the mold fixture such that the mold fixture is substantially free of lateral shift with respect to the wafer.

13. The method of claim 10, further including: applying a tunable amount of pressure through the mold fixture to each of the photonic devices.

14. The method of claim 10, wherein the concave openings each have a tapered cross-sectional profile.

15. The method of claim 10, further including:
 before the positioning, applying a flux material on each of the bonding pads so that the photonic devices are coupled to the bonding pads through the flux material; and
 before the covering, aligning the mold fixture with the wafer so that each concave opening is substantially aligned with a respective one of the photonic devices.

16. A method of fabricating a semiconductor device, comprising:
 providing a substrate having a plurality of conductive pads disposed thereon;
 placing a plurality of light-emitting diode (LED) dies over the conductive pads, respectively;
 providing a mold fixture, the mold fixture having a plurality of recesses, the recesses each being wider than any of the LED dies;
 securing the mold fixture to the substrate, wherein the LED dies are each inserted into a respective one of the recesses, and wherein a lateral movement of the LED dies with respect to the conductive pads is restricted by the recesses; and
 bonding, while the mold fixture is secured to the substrate, the LED dies to the conductive pads through a thermal process.

17. The method of claim 16, further comprising, before the securing the mold fixture to the substrate, aligning the mold fixture to the substrate such that each one of the recesses is aligned with a respective one of the LED dies.

18. The method of claim 16, wherein the recesses of the mold fixture each have sloped side walls.

19. The method of claim 16, wherein the securing comprises applying an external downward pressure to the mold fixture.

20. The method of claim 16, wherein:
 a flux material is disposed between the conductive pads and the LED dies; and
 the thermal process is performed at a sufficiently high temperature to melt the flux material.

* * * * *